United States Patent
Umeda et al.

(10) Patent No.: US 10,259,952 B2
(45) Date of Patent: Apr. 16, 2019

(54) CONDUCTIVE COATING MATERIAL FOR SHIELDING ELECTRONIC COMPONENT PACKAGE AND METHOD FOR PRODUCING SHIELDED PACKAGE

(71) Applicant: TATSUTA ELECTRIC WIRE & CABLE CO., LTD., Higashiosaka-shi, Osaka (JP)

(72) Inventors: Hiroaki Umeda, Kizugawa (JP); Kazuhiro Matsuda, Kizugawa (JP)

(73) Assignee: Tatsuta Electric Wire & Cable Co., Ltd., Osaka (JP)

( * ) Notice: Subject to any disclaimer, the term of this patent is extended or adjusted under 35 U.S.C. 154(b) by 34 days.

(21) Appl. No.: 15/501,105

(22) PCT Filed: Sep. 15, 2015

(86) PCT No.: PCT/JP2015/004699
§ 371 (c)(1),
(2) Date: Feb. 1, 2017

(87) PCT Pub. No.: WO2016/051700
PCT Pub. Date: Apr. 7, 2016

(65) Prior Publication Data
US 2017/0247550 A1   Aug. 31, 2017

(30) Foreign Application Priority Data

Sep. 30, 2014   (JP) .................................. 2014-201270

(51) Int. Cl.
*C09D 5/24*   (2006.01)
*C09D 7/40*   (2018.01)
(Continued)

(52) U.S. Cl.
CPC ............... *C09D 5/24* (2013.01); *C08G 59/46* (2013.01); *C08G 59/56* (2013.01); *C08K 5/07* (2013.01);
(Continued)

(58) Field of Classification Search
None
See application file for complete search history.

(56) References Cited

U.S. PATENT DOCUMENTS

| 2003/0160313 A1 | 8/2003 | Ichihashi et al. |
| 2006/0057340 A1* | 3/2006 | Umeda ................. H01B 1/22 428/209 |

(Continued)

FOREIGN PATENT DOCUMENTS

| CN | 1656573 A | 8/2005 |
| CN | 103996672 A | 8/2014 |

(Continued)

OTHER PUBLICATIONS

Brochure for CUREZOL Shikoku Chemicals Corporation, Mar. 2013.

*Primary Examiner* — Robert B Davis
(74) *Attorney, Agent, or Firm* — Norris McLaughlin, P.A.

(57) ABSTRACT

Provided herein is a conductive coating material that can be spray coated to form a shielding layer having desirable shielding performance, and desirable adhesion to a package. A shielded package producing method using the conductive coating material is also provided. The conductive coating material comprises at least (A) 100 parts by mass of a binder component containing 5 to 30 parts by mass of a solid epoxy resin that is solid at ordinary temperature, and 20 to 90 parts by mass of a liquid epoxy resin that is liquid at ordinary temperature, (B) 200 to 1800 parts by mass of metallic particles, and (C) 0.3 to 40 parts by mass of a curing agent.

(Continued)

The conductive coating material has a viscosity of 3 to 30 dPa·s.

8 Claims, 3 Drawing Sheets

(51) Int. Cl.
    *C08G 59/46*     (2006.01)
    *C08G 59/56*     (2006.01)
    *H01L 21/56*     (2006.01)
    *H01L 23/29*     (2006.01)
    *C09D 163/00*     (2006.01)
    *H01L 23/00*     (2006.01)
    *H01L 23/28*     (2006.01)
    *H01L 23/31*     (2006.01)
    *C08K 5/07*     (2006.01)
    *C08L 33/26*     (2006.01)
    *C09D 5/03*     (2006.01)
    *H01L 23/552*     (2006.01)

(52) U.S. Cl.
    CPC .............. *C08L 33/26* (2013.01); *C09D 5/031* (2013.01); *C09D 7/40* (2018.01); *C09D 163/00* (2013.01); *H01L 21/56* (2013.01); *H01L 23/00* (2013.01); *H01L 23/28* (2013.01); *H01L 23/29* (2013.01); *H01L 23/295* (2013.01); *H01L 23/31* (2013.01); *H01L 23/552* (2013.01); *H01L 24/97* (2013.01); *H01L 2924/3025* (2013.01)

(56) References Cited

U.S. PATENT DOCUMENTS

| | | |
|---|---|---|
| 2007/0148810 A1 | 6/2007 | Klein et al. |
| 2010/0315105 A1 | 12/2010 | Fornes |
| 2012/0126381 A1 | 5/2012 | Uenda et al. |
| 2014/0326929 A1 | 11/2014 | Hsueh et al. |
| 2018/0163063 A1* | 6/2018 | Gao ................ C09D 163/00 |

FOREIGN PATENT DOCUMENTS

| | | |
|---|---|---|
| CN | 104140780 A | 11/2014 |
| JP | 60-071641 A | 4/1985 |
| JP | S63-126114 A | 5/1988 |
| JP | 2003-258137 A | 9/2003 |
| JP | 2005-146181 A | 6/2005 |
| JP | 2005-179501 A | 7/2005 |
| JP | 2008-042152 A | 2/2008 |
| JP | 2010-083953 A | 4/2010 |
| JP | 2012-530359 A | 11/2012 |
| JP | 2014-220238 A | 11/2014 |

\* cited by examiner

CONDUCTIVE COATING MATERIAL FOR SHIELDING ELECTRONIC COMPONENT PACKAGE AND METHOD FOR PRODUCING SHIELDED PACKAGE

TECHNICAL FIELD

The present invention relates to a conductive coating material, and to a method for producing a shielded package using same.

BACKGROUND ART

Large quantities of electronic components of wireless communication apparatus for transmission of large data volume are mounted in today's electronic devices such as cell phones and tablet terminals. A problem of such electronic components for wireless communications is that they not only tend to generate noise, but are highly sensitive to noise, which causes malfunctions when exposed to external noise.

On the other hand, there is a demand for increasing the mount density of electronic components to make smaller and lighter electronic devices with advanced functionality. A problem of increasing the mount density is that it increases not only the number of electronic components that generate noise, but the number of electronic components affected by the noise.

A known conventional approach to this problem is shield packaging, whereby the noise-generating electronic components are covered in packages with a shielding layer to prevent noise generation from the electronic components, and noise entry into the electronic components. For example, Patent Literature 1 describes that an electromagnetic shield member having a high shielding effect can be easily obtained by spraying (atomizing) a conductive or semi-conductive material onto package surfaces to coat the package. A problem, however, is that desirable shielding performance may not be obtained, and the adhesion between the shielding layer and the package is poor when the shielding layer is formed by spray coating with a solution of metallic particles in a solvent.

A efficient production of a shielded package, for example, as described in Patent Literature 2a circuit module producing method is known that includes the step of coating a plurality of ICs with an insulating layer, the step of coating the insulating layer with a shielding layer made of a conductive paste, and the step of dividing the substrate having formed the shielding layer thereon (a method that a cutting groove which is wider at the base end and narrower at the top end in the depth direction of the insulating layer is formed on the insulating layer before forming the shielding layer that covers the insulating layer, and the substrate is divided by being cut along the top end of the cutting groove with a width wider than the top end and narrower than the base end after forming the shielding layer by applying a conductive resin into the cutting groove). The shielding layer may be formed by using various methods, including transfer molding, potting, and vacuum printing, as described in this publication. However, these methods are problematic because they all require large equipment, and are likely to cause trapping of bubbles when filling grooves with a conductive resin.

CITATION LIST

Patent Literature

Patent Literature 1: JP-A-2003-258137
Patent Literature 2: JP-A-2008-42152

SUMMARY OF INVENTION

Technical Problem

The present invention has been made under these circumstances, and it is an object of the present invention to provide a conductive coating material that can be spray coated to form a shielding layer having desirable shielding performance, and desirable adhesion for a package. The present invention is also intended to provide a shielded package producing method that enables forming the shielding layer with ease.

Solution to Problem

In view of the above, a conductive coating material of the present invention comprises at least:
(A) 100 parts by mass of a binder component containing 5 to 30 parts by mass of a solid epoxy resin that is solid at ordinary temperature, and 20 to 90 parts by mass of a liquid epoxy resin that is liquid at ordinary temperature, a total of the solid epoxy resin and the liquid epoxy resin not exceeding 100 parts by mass;
(B) 200 to 1800 parts by mass of metallic particles; and
(C) 0.3 to 40 parts by mass of a curing agent,
the conductive coating material having a viscosity of 3 to 30 dPa·s.

It is preferable that the liquid epoxy resin contains 5 to 35 parts by mass of a liquid glycidylamine epoxy resin, and 20 to 55 parts by mass of a liquid glycidyl ether epoxy resin, a total of the liquid glycidylamine epoxy resin and the liquid glycidyl ether epoxy resin not exceeding 90 parts by mass.

It is preferable that the liquid glycidylamine epoxy resin has an epoxy equivalent of 80 to 120 g/eq, and a viscosity of 1.5 Pa·s or less, and that the liquid glycidyl ether epoxy resin has an epoxy equivalent of 180 to 220 g/eq, and a viscosity of 6 Pa·s or less.

In the conductive coating material, the (A) binder component may further contain a (meth)acrylate compound.

The metallic particles may have at least one shape selected from the group consisting of a flake-like shape, a dendritic shape, a spherical shape, and a fibrous shape.

Preferably, the conductive coating material is for shielding an electronic component package.

A shielded package producing method of the present invention is a method for producing a shielded package, wherein an electronic component is mounted on a substrate and sealed with a sealant to form a sealed package and the sealed package is coated with a shielding layer, the method comprising the steps of:
mounting a plurality of electronic components on a substrate, and charging a sealant onto the substrate and curing the sealant to seal the electronic components;
cutting the sealant between the plurality of electronic components to form a groove, and separating the electronic components on the substrate into individual packages by the groove;
applying the conductive coating material of the present invention onto the substrate where the separated packages is formed by way of spraying;

heating the substrate coated with the conductive coating material to cure the conductive coating material and therefore form a shielding layer; and cutting the substrate where the shielding layer is formed along the groove to obtain individual shielded packages.

Advantageous Effects of Invention

The conductive coating material of the present invention can be used to form a coating of uniform thickness by spraying method. By being spray coated on package surfaces, the conductive coating material can easily form a shielding layer having an excellent shielding effect, and excellent adhesion to the package.

The shielded package producing method of the present invention can efficiently produce a shielded package having excellent shielding performance and excellent adhesion to the package, without using large-scale equipment.

DESCRIPTION OF EMBODIMENTS

Figure 1:
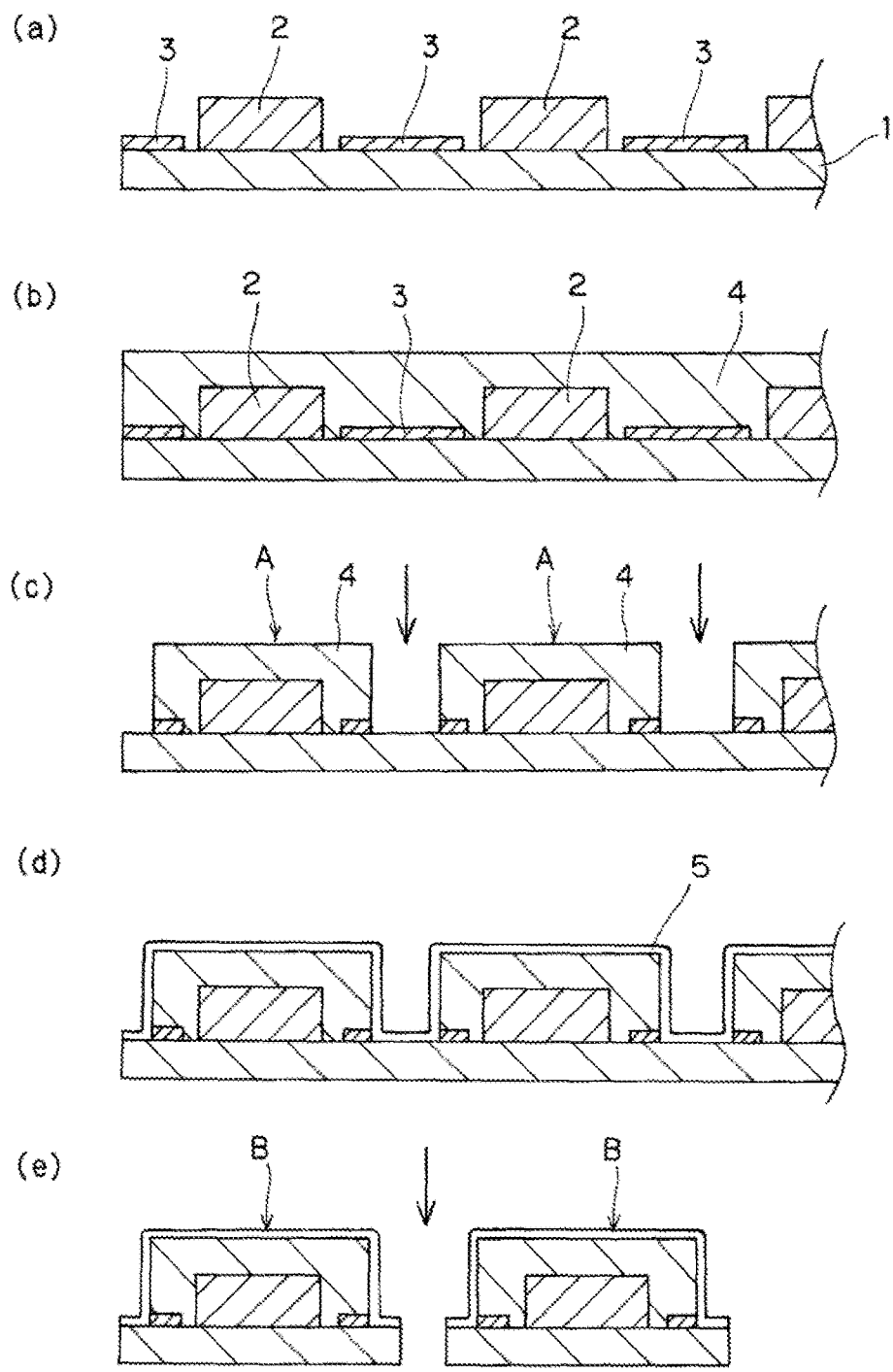
FIG. 1 is a schematic cross sectional view representing an embodiment of a shielded package producing method.

A conductive coating material according to the present invention at least contains, with respect to (A) 100 parts by mass of a binder component containing an epoxy resin that is solid at ordinary temperature (hereinafter, also referred to as "solid epoxy resin") and an epoxy resin that is liquid at ordinary temperature (hereinafter, also referred to as "liquid epoxy resin"), (B) 200 to 1800 parts by mass of metallic particles and (C) 0.3 to 40 parts by mass of a curing agent, as noted above. The use of the conductive coating material is not particularly limited. However, the conductive coating material is preferably used to form a shielding layer by spraying or so onto package surfaces in mist form before or after separating the package, and thereby to obtain a shielded package.

The binder component in the conductive coating material of the present invention contains the epoxy resins as essential components, and may contain a (meth)acrylate compound, as required.

As used herein, "solid at ordinary temperature" used in conjunction with the epoxy resin means that the epoxy resin is not fluidic in a solvent-free state at 25° C., and "liquid at ordinary temperature" means that the epoxy resin is fluidic under the same conditions. The solid epoxy resin is contained in preferably 5 to 30 parts by mass, more preferably 5 to 20 parts by mass with respect to 100 parts by mass of the binder component. The liquid epoxy resin is contained in preferably 20 to 90 parts by mass, more preferably 25 to 80 parts by mass with respect to 100 parts by mass of the binder component.

By employing the epoxy resin that is solid at ordinary temperature, a conductive coating material, which can be uniformly applied to package surfaces and can form a uniform shielding layer, may be obtained. Preferably, the solid epoxy resin is one that contains two or more glycidyl groups within the molecule, and that has an epoxy equivalent of 150 to 280 g/eq. Defects such as cracking and warping are hard to occur when the epoxy equivalent is 150 g/eq or more, and the coating with more desirable heat resistance can be obtained with an epoxy equivalent of 280 g/eq or less.

The solid epoxy resin may be used by being dissolved in a solvent. The solvent used is not particularly limited, and may be appropriately selected from solvents described later.

Non-limiting specific examples of the solid epoxy resin include: bisphenol epoxy resins such as bisphenol A epoxy resins, bisphenol F epoxy resins, and bisphenol S epoxy resins; glycidyl ether epoxy resins such as spiro-ring epoxy resins, naphthalene epoxy resins, biphenyl epoxy resins, terpene epoxy resins, tris(glycidyloxyphenyl)methane, and tetrakis(glycidyloxyphenyl)ethane; glycidylamine epoxy resins such as tetraglycidyl diaminodiphenylmethane; novolac epoxy resins such as tetrabromobisphenol A epoxy resins, cresol novolac epoxy resins, phenol novolac epoxy resins, α-naphthol novolac epoxy resins, and brominated phenol novolac epoxy resins; and rubber modified epoxy resins. These may be used alone or in a combination of two or more.

The epoxy resin that is liquid at ordinary temperature is used in 20 to 90 parts by mass with respect to 100 parts by mass of the binder component, as noted above. Preferably, 5 to 35 parts by mass of the liquid epoxy resin is a liquid glycidylamine epoxy resin, and 20 to 55 parts by mass of the liquid epoxy resin is a liquid glycidyl ether epoxy resin. When both liquid glycidylamine epoxy resin and the liquid glycidyl ether epoxy resin are employed within the ranges of amount described above, the conductive coating material can have a good balance of conductivity and adhesion, and becomes even less likely to cause warping in the cured coating, making it possible to obtain a shielded package having more desirable heat resistance.

Preferably, the liquid glycidylamine liquid epoxy resin has an epoxy equivalent of 80 to 120 g/eq, and a viscosity of 1.5 Pa·s or less, more preferably 0.5 to 1.5 Pa·s. Preferably, the liquid glycidyl ether epoxy resin has an epoxy equivalent of 180 to 220 g/eq, and a viscosity of 6 Pa·s or less, more preferably 1 to 6 Pa·s. By using the liquid glycidylamine epoxy resin and the liquid glycidyl ether epoxy resin in these preferred epoxy equivalent and viscosity ranges, the cured coating film becomes even less likely to warp, and a shielded package having more desirable heat resistance and a more uniform coating thickness may be obtained.

The (meth)acrylate compound usable in the present invention is an acrylate compound or a methacrylate compound, and is not particularly limited, as long as it is a compound having an acryloyl group or a methacryloyl group. Examples of the (meth)acrylate compound include isoamylacrylate, neopentyl glycol diacrylate, trimethylolpropane triacrylate, ditrimethylolpropane tetraacrylate, 2-hydroxy-3-acryloyloxypropyl methacrylate, phenylglycidyl ether acrylate hexamethylene diisocyanate urethane prepolymer, bisphenol A diglycidyl ether acrylic acid adduct, ethylene glycol dimethacrylate, and diethylene glycol dimethacrylate. These may be used alone or in a combination of two or more.

The mixture ratio of the epoxy resins and the (meth)acrylate compound when using a (meth)acrylate compound (mass % with respect to the total 100% of both components) is preferably 5:95 to 95:5, more preferably 20:80 to 80:20. With the (meth)acrylate compound contained in 5 mass % or more, the conductive coating material can have desirable preservation stability, and can be quickly cured. It is also possible to prevent the coating material from running down while being cured. With the (meth)acrylate compound contained in 95 mass % or less, the adhesion between a package and the shielding layer easily improves.

Modifying agents, such as an alkyd resin, a melamine resin, and a xylene resin may be added to the binder component for the purpose of improving the properties of the conductive coating material, in addition to the epoxy resins, and the (meth)acrylate compound.

When blended into the binder component, the modifying agent content is preferably 40 mass % or less, more preferably 10 mass % or less of the binder component from the standpoint of the adhesion between the shielding layer and a package.

The present invention uses a curing agent for curing the binder component. The curing agent is not particularly limited. Examples include phenol-based curing agents, imidazole-based curing agents, amine-based curing agents, cationic curing agents, and radical curing agents. These may be used alone or in a combination of two or more.

Examples of the phenol-based curing agents include novolac phenol and naphthol-based compounds or the like.

Examples of the imidazole-based curing agents include imidazole, 2-undecylimidazole, 2-heptadecylimidazole, 2-ethylimidazole, 2-phenylimidazole, 2-ethyl-4-methyl-imidazole, 1-cyanoethyl-2-undecylimidazole, and 2-phenylimidazole.

Examples of the cationic curing agents include onium compounds such as amine salts of boron trifluoride, p-methoxybenzenediazonium hexafluorophosphate, diphenyliodonium hexafluorophosphate, triphenylsulfonium, tetra-n-butylphosphonium tetraphenylborate, and tetra-n-butylphosphonium-o,o-diethylphosphorodithioate.

Examples of the radical curing agents (polymerization initiator) include di-cumyl peroxide, t-butylcumyl peroxide, t-butyl hydroperoxide, and cumene hydroperoxide.

The amount of the curing agent depends on the type of the curing agent used. Typically, the amount of curing agent is preferably 0.3 to 40 parts by mass, more preferably 0.5 to 35 parts by mass with respect to the total 100 parts by mass of the binder component. With the curing agent contained in 0.3 parts by mass or more, the adhesion between the shielding layer and package surfaces, and the conductivity of the shielding layer become desirable, which makes it easier to obtain a shielding layer having a desirable shielding effect. With the curing agent contained in 35 parts by mass or less, it becomes easier to maintain desirable preservation stability for the conductive coating material.

The coating material of the present invention may contain known additives, such as a defoaming agent, a thickener, an adhesive, a filler, a fire retardant, and a colorant, provided that such addition is not detrimental to the purposes of the invention.

The metallic particles usable in the present invention are not particularly limited, provided that the particles are conductive. Examples include copper particles, silver particles, nickel particles, silver-coated copper particles, gold-coated copper particles, silver-coated nickel particles, and gold-coated nickel particles. The metallic particles may be spherical, flake-like (scale-like), dendritic, spherical, or fibrous in shape. The metallic particles are preferably flake-like, dendritic, or spherical, more preferably flake-like in terms of obtaining a shielding layer having a small resistance value, and improved shielding performance.

The amount of the metallic particles is preferably 200 to 1800 parts by mass with respect to 100 parts by mass of the binder component. The conductivity of the shielding layer becomes desirable when the metallic particle amount is 200 parts by mass or more. When the amount of the metallic particle is 1800 parts by mass or less, the adhesion between the shielding layer and the package, and the physical properties of the conductive coating material after being cured become desirable, and the shielding layer becomes less likely to chip upon being cut with a dicing saw (described later).

The average particle size of the metallic particles is preferably 1 to 30 μm. With an average particle size of 1 μm or more, the metallic particles can have desirable dispersibility, particle aggregation can be prevented, and oxidation is less likely to occur. With an average particle size of 30 μm or less, a package can be more desirably joined to a ground circuit.

When the metallic particles are flake-like particles, the metallic particles preferably have a tap density of 4.0 to 6.0 g/cm$^3$. The shielding layer can have desirable conductivity with the tap density falling in this range.

When the metallic particles are flake-like particles, the metallic particles preferably have an aspect ratio of preferably 5 to 10. The shielding layer can have desirable conductivity with the aspect ratio falling in this range.

In order to uniformly apply the conductive coating material to package surfaces by spraying, it is preferable that the conductive coating material of the present invention has a viscosity lower than that of a conductive paste.

Specifically, the conductive coating material of the present invention preferably has a viscosity of 3 to 30 dPa·s, more preferably 5 to 20 dPa·s. With a viscosity of 3 dPa·s or more, the liquid can be prevented from running down the wall surfaces of a package, and therefore the shielding layer can be uniformly formed, as well as settling of metallic particles also can be prevented. With a viscosity of 30 dPa·s or less, clogging of spray nozzles can be prevented, and it becomes easier to uniformly form the shielding layer on package surfaces, including side wall surfaces.

Because the viscosity of the conductive coating material varies with factors such as the viscosity of the binder component and the amount of the metallic particles, a solvent may be used to achieve the foregoing viscosity ranges. The solvent usable in the present invention is not particularly limited. Examples include methyl ethyl ketone, acetone, acetophenone, methyl cellosolve, methyl cellosolve acetate, methyl carbitol, diethylene glycol dimethyl ether, tetrahydrofuran, and methyl acetate. These may be used alone or in a combination of two or more.

The amount of solvent may be appropriately adjusted so that the viscosity of the conductive coating material falls in the foregoing ranges. The adequate amount of solvent is 20 to 300 parts by mass with respect to 100 parts by mass of the binder component, though it varies with factors such as the viscosity of the binder component and the amount of the metallic particles.

The shielding layer obtained from the conductive coating material of the present invention has excellent adhesion to a ground circuit formed of copper foil. Specifically, because the shielding layer has desirable adhesion to the copper foil of the ground circuit partially exposed from the shielded package, the shielding layer can be prevented from being delaminated from the ground circuit by the impact of cutting when the package is cut into individual pieces after the shielding layer is formed of the conductive coating material applied to shielded package surfaces.

The adhesion between the conductive coating material and the copper foil is preferably 3.0 MPa or more in terms of a shear strength as measured according to JIS K 6850: 1999. With a shear strength of 3.0 MPa or more, the shielding layer can be prevented from being delaminated from the ground circuit by the impact of cutting the package into individual pieces.

The shielding layer formed of the conductive coating material of the present invention preferably has a resistivity of $2\times10^{-4}$ Ω·cm or less from the standpoint of obtaining excellent shielding properties.

An embodiment of a method for obtaining a shielded package by using the conductive coating material of the present invention is described below with reference to the accompanying drawings.

As illustrated in FIG. 1, (a), a plurality of electronic components (such as ICs) 2 is mounted on a substrate 1, and ground circuit patterns (copper foil) 3 are installed between the electronic components 2.

Thereafter, as illustrated in FIG. 1, (b), a sealant 4 is filled onto the electronic components 2 and the ground circuit patterns 3, and cured to seal the electronic components 2.

Thereafter, as indicated by arrows in FIG. 1, (c), the sealant 4 is cut between the electronic components 2 to form grooves, and separates the electronic components on the substrate 1 into individual packages by the grooves. Each separated package is indicated by reference sign A. The ground circuit is at least partially exposed on the wall surfaces forming the grooves, and the bottom portion of the grooves does not fully penetrate through the substrate.

On the other hand, the above-mentioned predetermined amounts of the binder component, the metallic particles, and the curing agent are mixed, with a solvent and/or a modifying agent if necessary, to have the conductive coating material prepared.

The conductive coating material is evenly applied over the package surfaces by being expelled in mist form using a known spray gun or the like. Here, the spray pressure, the spray rate, and the distance between the spray injection port of the spray gun and the package surface are appropriately set, as required.

Figure 2:
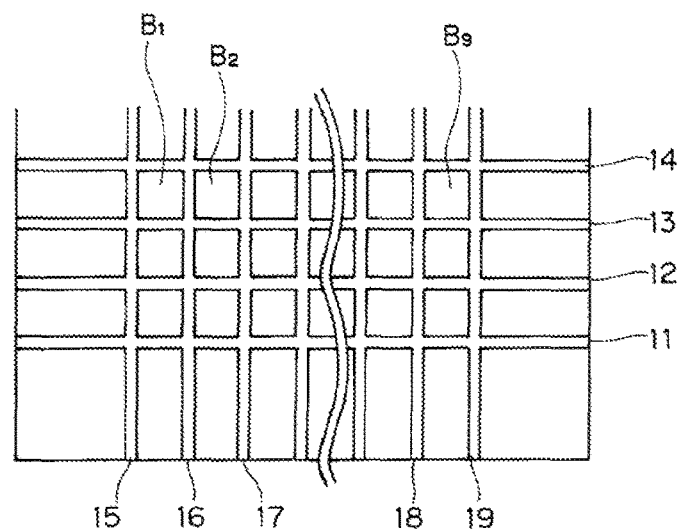
FIG. 2 is a plan view representing an example of a shielded package before separation.

The package with the applied conductive coating material is heated so as to dry the solvent, then kept heated so that the (meth)acrylate compound and the epoxy resins in the conductive coating material become sufficiently cured to form a shielding layer (conductive coating film) 5 on the package surfaces, as illustrated in FIG. 1, (d). The heating conditions may be appropriately set. FIG. 2 is a plan view representing the substrate in this state. The unseparated shielded packages are indicated by reference signs $B_1$ to $B_9$. The grooves between the shielded packages are indicated by reference signs 11 to 19.

Thereafter, as indicated by arrow in FIG. 1 (e), the substrate is cut along the bottom portion of the grooves on the unseparated packages by using a dicing saw or the like to obtain individual packages B.

With the shielding layer uniformly formed on the package surfaces (including the top surface portion, side surface portions, and the corners where the top surface portion and the side surface portions meet), the individual package B can have desirable shielding properties. Further, because the shielding layer has excellent adhesion for the package surfaces and the ground circuit, the shielding layer can be prevented from being delaminated from the package surfaces and the ground circuit by the impact of separating the packages with a dicing saw or the like.

EXAMPLES

The substance of the present invention is described below in detail using Examples. The present invention, however, is not limited by the following. In the following, "parts" or "%" is by mass, unless otherwise stated.

1. Preparation and Evaluation of Conductive Coating Material

Example 1

A solid epoxy resin (Mitsubishi Chemical Corporation product JER 157S70; 15 parts by mass), a liquid epoxy resin (35 parts by mass), and 2-hydroxy-3-acryloyloxypropyl methacrylate (Kyoeisha Chemical Co., Ltd. Product Light Ester G-201P; 50 parts by mass), which were 100 parts by mass in total, were used as binder components. The liquid epoxy resin was used as a mixture of 10 parts by mass of glycidylamine epoxy resin (ADEKA Corporation product EP-3905S), and 25 parts by mass of glycidyl ether epoxy resin (ADEKA Corporation product EP-4400). 2-Methylimidazole (Shikoku Chemicals Corporation product 2MZ-H; 5 parts by mass), and phenol novolac (Arakawa Chemical Industries product Tamanol 758; 15 parts by mass) were used as curing agents. Methyl ethyl ketone (MEK) was used as solvent. A flake-like silver-coated copper powder with an average particle size of 5 μm was used as metallic particles. These were mixed according to the amounts shown in Table 1 to obtain a conductive coating material. The conductive coating material (liquid temperature 25° C.) had a viscosity of 11 dPa·s as measured with a BH-type viscometer (rotor No. 5, 10 rpm).

Examples 2 to 7, and Comparative Examples 1 to 4

Conductive coating materials were obtained in the same manner as in Example 1, except that the binder components, the curing agents, the solvent, and the metal powder were mixed as shown in Table 1. The spherical metal powder used in Example 5 is a silver-coated copper powder with an average particle size of 5 μm (silver coating: 10% by mass). The obtained conductive coating materials were each measured for viscosity in the same manner as in Example 1. The measured viscosity values are presented in Table 1.

The conductive coating materials of Examples and Comparative Examples were evaluated as follows. The results are presented in Table 1.

(1) Conductivity of Conductive Coating Film

The conductivity of the conductive coating film obtained with the conductive coating material of Example 1 was evaluated in terms of resistivity. For the resistivity measurement, the conductive coating materials obtained in Examples 1 to 7 and Comparative Examples 1 to 4 were each printed in lines (a length of 60 mm, a width of 5 mm, and a thickness of about 100 μm) using a printing plate prepared by attaching a 55 μm-thick polyimide film with 5-mm slits on a glass epoxy substrate. After being pre-heated at 80° C. for 60 min, the material was permanently cured by being heated at 160° C. for 60 min, and the polyimide film was peeled off. The cured sample was then measured for resistance (R, Ω) at the both ends using a tester, and the resistivity (Ω·cm) was calculated from the cross sectional area (S, cm$^2$) and the length (L, cm) according to the following formula (1).

[Formula 1]

$$\text{Resistivity} = \frac{S}{L} \times R \quad (1)$$

The cross sectional area, the length, and the resistance of the sample were determined as mean values from a total of 15 lines printed on three glass epoxy substrates (5 lines per substrate). The conductive coating material can desirably be used as a shielding layer when it has a resistivity of $2 \times 10^{-4}$ $\Omega \cdot$cm or less. The conductive coating material of Example 1 had a resistivity of $9 \times 10^{-5}$ $\Omega \cdot$cm, a value desirable for use as a shielding layer.

The same resistivity measurement was performed in Examples 2 to 7, and Comparative Examples 1 to 4. The resistivity was $2 \times 10^{-4}$ $\Omega \cdot$cm or less in Examples 2 to 7, confirming that the conductive coating materials were desirable for use as shielding layers. On the other hand, the resistivity was far above $2 \times 10^{-4}$ $\Omega \cdot$cm in Comparative Example 2, confirming that the conductive coating material was not suited for use as a shielding layer.

(2) Adhesion of Conductive Coating Material (Shear Strength Measurement Before and after Dip Soldering)

The adhesion of the shielding layer for the package surfaces or the ground circuit was evaluated by measuring the shear strength according to JIS K 6850: 1999. Specifically, the conductive coating material was applied to a region over a length of 12.5 mm on a copper plate measuring 25 mm in width, 100 mm in length, and 1.6 mm in thickness, and mated with another copper plate measuring 25 mm in width, 100 mm in length, and 1.6 mm in thickness. The whole was heated first at 80° C. for 60 min, and then at 160° C. for 60 min to bond the copper plates to each other. The bonded surfaces were pulled parallel away from each other using a tensile strength tester (Shimadzu Corporation product Autograph AGS-X), and the shear strength was calculated by dividing the maximum load at break by the bonding area. The coating material is usable without any problems when it has shear strength of 3.0 MPa or more.

The shear strength was 3.0 MPa or more in Examples 1 to 7, confirming that the conductive coating materials were desirable for use as shielding layers. On the other hand, the shear strength was less than 3.0 MPa in Comparative Example 3, confirming that the adhesion of the shielding layer was insufficient.

The adhesion was also evaluated after dip soldering. Because the package is exposed to high temperature in dip soldering, the adhesion of the shielding layer for the package surfaces and the ground circuit after such exposure to high temperature is also important. In order to measure the post-dip soldering adhesion, the conductive coating material was applied between copper plates, and cured by being heated at 80° C. for 60 min, and then 160° C. for 60 min in the manner described above. Furthermore, the conductive coating material was floated in a 260° C. solder for 30 s, and then measured for shear strength. The shear strength was measured in the same manner described above.

The conductive coating material is perfectly usable as a shielding layer when it has a shear strength of 3.0 MPa or more after dip soldering. The post-dip soldering shear strength was 3.0 MPa or more in Examples 1 to 7, confirming that the conductive coating materials were desirable for use as shielding layers. On the other hand, the post-dip soldering shear strength was less than 3.0 MPa in Comparative Example 3, confirming that the adhesion was insufficient.

2. Evaluation of Shielding Layer on Package Surface

As a model of unseparated package, a glass epoxy substrate as follows was used. The substrate had nine rows and nine columns of 1-cm$^2$ island portions formed as pseudo-packages which were obtained byr performing the spot facing forming ten horizontal and ten vertical grooves in a width of 1 mm and a depth of 2 mm. The conductive coating materials obtained in Examples 1 to 7 and Comparative Examples 1 to 4 were sprayed onto the package surfaces using a commercially available spray gun (Anest Iwata Corporation product LPH-101A-144LVG) under the following spray conditions, and allowed to stand at 25° C. for 30 min to evaporate the solvent. The conductive coating material was then cured by being heated first at 80° C. for 60 min, and then at 160° C. for 60 min.

<Spray Conditions>

Airflow rate: 200 L/min, coating time: 9 s

Supply pressure: 0.5 MPa

Package surface temperature: 25° C.

Figure 3:
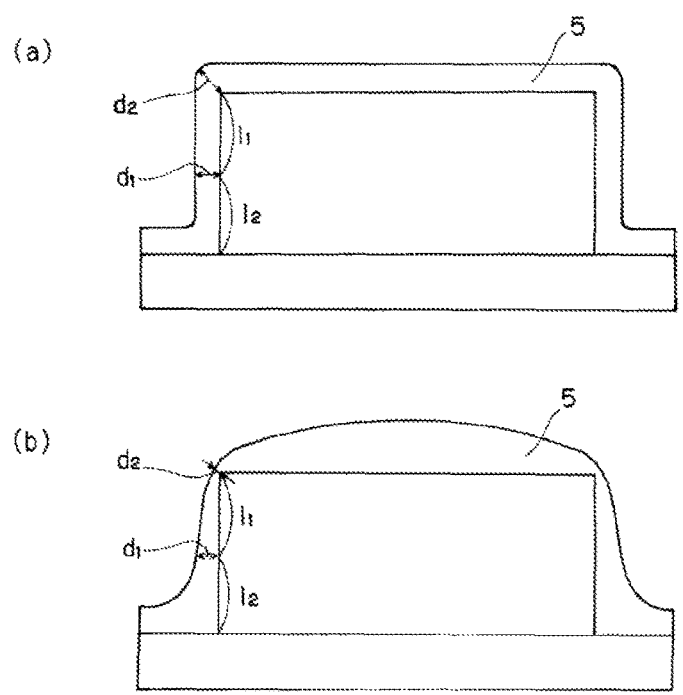
FIG. 3 is a schematic cross sectional view of a shielded package for explaining a coating uniformity evaluation method.

Distance from package surface to nozzle: about 20 cm (1) Thickness Uniformity of Shielding Layer The thickness of the shielding layer was calculated by a thickness difference between the corner portion and the wall surface portion in a cross section of the package with the shielding layer. Specifically, as illustrated in FIG. 3, the value calculated from the formula $((d_1 - d_2)/d_1)$ was used as an index of uniformity, where $d_1$ is the thickness of the shielding layer formed on the package side surface (as measured at the center of the height of the side surface, with distance $I_1$ from the top surface to the measurement point being equal to distance $I_2$ from the bottom surface to the measurement point), and $d_2$ is the thickness of the shielding layer formed at the corner portion of the package (as measured in a 45 degree angle direction upward with respect to the horizontal surface). The thickness was determined as 'satisfactory', and the shielding layer was considered desirable when the index value was 60% or less.

The shielding layer thickness becomes more uniform as the thickness difference approaches zero. However, an attempt to form a shielding layer at the corner portions with conventional conductive coating materials results in an increased thickness at the wall surface portion, and the resistance value of the shielding layer becomes uneven. On the other hand, an attempt to reduce the thickness at the wall surface portion results in the shielding layer not being formed at the corner portions, and the shielding effect cannot be obtained. The thickness difference between the corner portion and the wall surface portion of the shielding layer was 60% or less in Examples 1 to 7, confirming that the shielding layer was desirable for use. On the other hand, the thickness difference between the corner portion and the wall surface portion exceeded 60% in the shielding layers of Comparative Examples 1, 2, and 4.

(2) Conductivity of Shielding Layer

The conductivity of the shielding layer was measured in terms of a resistance value. Specifically, one of the rows configured from cubic island portions formed by spot facing was randomly selected, and the resistance value between the island portions at the both ends of the selected row (between $B_1$ and $B_9$ in FIG. 2) was measured. The conductivity was determined as 'satisfactory', and the shielding layer was considered desirable when the resistance value was 100 m$\Omega$ or less.

As shown in Table 1, the resistance value was 100 m$\Omega$ or less in all of Examples 1 to 7, confirming that the shielding layer was desirable for use. On the other hand, the resistance value was ∞Ω (above the measurement limit) in Comparative Examples 1, 2, and 4, confirming that the shielding layer was unsuited for use.

(3) Long-Term Reliability of Shielding Layer

Figure 4:
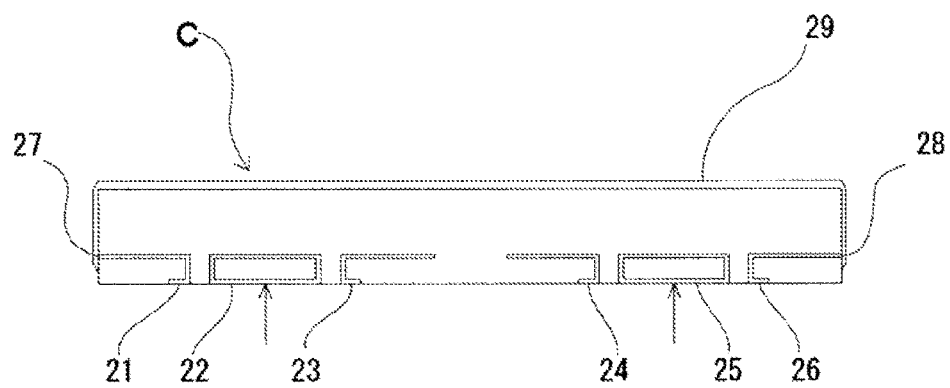
FIG. 4 is a schematic cross sectional view representing a chip sample used in long-term reliability testing of a shielding layer.

The long-term reliability of the shielding layer was evaluated by a change in resistance value after a heat cycle test. Specifically, as illustrated in FIG. 4, Chip sample C (1.0 cm×1.0 cm, thickness 1.3 mm) made from a glass epoxy substrate (FR-5) and having circuits 21 to 26 formed of a 35 m-thick copper foil and plated through holes in the internal layer was used. The circuits 21, 22, and 23 are a part of a continuous circuit. The circuits 24, 25, and 26 are a part of another continuous circuit. However, the circuits 21 to 23, and the circuits 24 to 26 are not connected to each other. The circuits 22 and 25 have pad portions where the copper foil is partially exposed at the portion indicted by arrows on the bottom of the chip sample. The circuits 21 and 26 have terminal portions 27 and 28 exposed at the end surfaces of the chip sample.

The conductive coating material was applied onto the surfaces of the chip sample C under the foregoing spray conditions, and cured to form a shielding layer (conductive coating film) 29 having a thickness of about 30 μm. After this procedure, the two pad portions were electrically connected to each other via the conductive coating film 29 that was in contact with the terminal portions 27 and 28, and the resistance value between the pads was measured to obtain a resistance value before reliability test. After the chip sample C was placed in a JEDEC LEVEL 3 environment (an environment with 30° C. room temperature and 60% RH relative humidity) for 192 h, it was exposed to 260° C. temperature for 10 s as a reflow test. After the reflow test, the chip sample C was then subjected to 3000 cycles of heat cycle test (−65° C. for 30 min⇆125° C. for 30 min), and a resistance value after reliability test was obtained. Changes in resistance were calculated from the obtained resistance values before and after the reliability test, using the following formula. The long-term reliability was determined as desirable when the change rate was 50% or less.

Change rate (%)=((B−A)/A)×100     Formula:

A: Resistance value before reliability test
B: Resistance value after reliability test

TABLE 1

| | | Example | | | | |
|---|---|---|---|---|---|---|
| | | 1 | 2 | 3 | 4 | 5 |
| Solid epoxy resin (mass parts) | | 15 | 15 | 15 | 15 | 15 |
| Liquid epoxy resin (mass parts) | | 35 | 35 | 35 | 50 | 35 |
| Components | Glycidylamine epoxy resin | 10 | 10 | 10 | 10 | 10 |
| | Glycidyl ether epoxy resin | 25 | 25 | 25 | 40 | 25 |
| (Meth)acrylate compound (mass parts) | | 50 | 50 | 50 | 35 | 50 |
| Curing agent (mass parts) | | 20 | 20 | 20 | 20 | 20 |
| Solvent (MEK) (mass parts) | | 110 | 290 | 20 | 110 | 110 |
| Metallic powder | Flake-like | 1000 | 1800 | 300 | 1000 | — |
| (mass parts) | Spherical | — | — | — | — | 1000 |
| Viscosity (dPa · S) | | 11 | 29 | 14 | 6 | 4 |
| Conductivity of conductive coating film (×10$^{-5}$ Ω · cm) | | 9 | 7 | 11 | 10 | 15 |
| Adhesion of conductive | Before dip soldering | 7.5 | 4.4 | 8.2 | 7.3 | 7 |
| coating film (Shear strength, Mpa) | After dip soldering | 8.1 | 4.3 | 7.8 | 8.3 | 7.2 |
| Spray test | Uniformity of shielding layer thickness | Satisfactory | Satisfactory | Satisfactory | Satisfactory | Satisfactory |
| | Conductivity of shielding layer | Satisfactory | Satisfactory | Satisfactory | Satisfactory | Satisfactory |
| | Long-term reliability of shielding layer (Change rate in resistance after reliability test (%)) | 30 | 35 | 48 | 39 | 46 |

| | | Example | | Comparative Example | | | |
|---|---|---|---|---|---|---|---|
| | | 6 | 7 | 1 | 2 | 3 | 4 |
| Solid epoxy resin (mass parts) | | 15 | 20 | 15 | 15 | 0 | 15 |
| Liquid epoxy resin (mass parts) | | 60 | 80 | 35 | 35 | 0 | 35 |
| Components | Glycidylamine epoxy resin | 10 | 30 | 10 | 10 | 0 | 10 |
| | Glycidyl ether epoxy resin | 50 | 50 | 25 | 25 | 0 | 25 |
| (Meth)acrylate compound (mass parts) | | 25 | 0 | 50 | 50 | 100 | 50 |
| Curing agent (mass parts) | | 20 | 20 | 20 | 20 | 20 | 20 |
| Solvent (MEK) (mass parts) | | 110 | 110 | 10 | 130 | 110 | 70 |
| Metallic powder | Flake-like | 1000 | 1000 | 1000 | 180 | 1000 | 1000 |
| (mass parts) | Spherical | — | — | — | — | — | — |
| Viscosity (dPa · S) | | 25 | 27 | 195 | 1 | 8 | 50 |
| Conductivity of conductive coating film (×10$^{-5}$ Ω · cm) | | 14 | 20 | 9.6 | 360 | 12 | 7 |
| Adhesion of conductive coating film | Before dip soldering | 7.3 | 7.6 | 7.2 | 8.2 | 1 or less | 7.1 |
| (Shear strength, Mpa) | After dip soldering | 7 | 7.2 | 7 | 8.3 | 1 or less | 7.9 |
| Spray test | Uniformity of shielding layer thickness | Satisfactory | Satisfactory | Poor | Poor | Satisfactory | Poor |
| | Conductivity of shielding layer | Satisfactory | Satisfactory | Poor | Poor | Satisfactory | Poor |
| | Long-term reliability of shielding layer (Change rate in resistance after reliability test (%)) | 41 | 37 | ∞ | ∞ | ∞ | ∞ |

REFERENCE SIGNS LIST

A: Individual packages on substrate
B, $B_1$, $B_2$, $B_9$: Individual shielded package
C: Chip sample
1: Substrate
2: Electronic component
3: Ground circuit pattern (copper foil)
4: Sealant
5: Shielding layer (conductive coating film)
11 to 19: Groove
21 to 26: Circuit
27, 28: Terminal portion of circuit
29: Shielding layer (conductive coating film)

The invention claimed is:

1. A conductive coating material for shielding an electronic component package comprising at least:
   (A) 100 parts by mass of a binder component containing 5 to 30 parts by mass of a solid epoxy resin that is solid at ordinary temperature, and 20 to 90 parts by mass of a liquid epoxy resin that is liquid at ordinary temperature, a total of the solid epoxy resin and the liquid epoxy resin not exceeding 100 parts by mass;
   (B) 200 to 1800 parts by mass of metallic particles; and
   (C) 0.3 to 40 parts by mass of a curing agent,
   the conductive coating material having a viscosity of 3 to 30 dPa·s,
   wherein the liquid epoxy resin comprises 5 to 35 parts by mass of a liquid glycidylamine epoxy resin, and 20 to 55 parts by mass of a liquid glycidyl ether epoxy resin.

2. The conductive coating material according to claim 1, wherein the liquid glycidylamine epoxy resin has an epoxy equivalent of 80 to 120 g/eq, and a viscosity of 1.5 Pa·s or less, and wherein the liquid glycidyl ether epoxy resin has an epoxy equivalent of 180 to 220 g/eq, and a viscosity of 6 Pa·s or less.

3. The conductive coating material according to claim 1 or 2, wherein the (A) binder component further contains a (meth)acrylate compound.

4. The conductive coating material according to claim 1 or 2, wherein the metallic particles have at least one shape selected from the group consisting of a flake-like shape, a spherical shape, and a fibrous shape.

5. The conductive coating material according to claim 3, wherein the metallic particles have at least one shape selected from the group consisting of a flake-like shape, a spherical shape, and a fibrous shape.

6. A producing method of a shielded package wherein an electronic component is mounted on a substrate and sealed with a sealant to form a sealed package and the sealed package is coated by a shield layer,
   the method comprising the steps of:
   mounting a plurality of electronic components on a substrate, and charging a sealant onto the substrate and curing the sealant to seal the electronic components;
   cutting the sealant between the plurality of electronic components to form a groove, and separating the electronic components on the substrate into individual packages by the groove;
   applying the conductive coating material of claim 1 or 2 onto the substrate where the separated packages is formed by way of spraying;
   heating the substrate coated with the conductive coating material to cure the conductive coating material and therefore form a shielding layer; and
   cutting the substrate where the shielding layer is formed along the groove to obtain individual shielded packages.

7. A producing method of a shielded package wherein an electronic component is mounted on a substrate and sealed with a sealant to form a sealed package and the sealed package is coated by a shield layer,
   the method comprising the steps of:
   mounting a plurality of electronic components on a substrate, and charging a sealant onto the substrate and curing the sealant to seal the electronic components;
   cutting the sealant between the plurality of electronic components to form a groove, and separating the electronic components on the substrate into individual packages by the groove;
   applying the conductive coating material of claim 3 onto the substrate where the separated packages is formed by way of spraying;
   heating the substrate coated with the conductive coating material to cure the conductive coating material and therefore form a shielding layer; and
   cutting the substrate where the shielding layer is formed along the groove to obtain individual shielded packages.

8. A producing method of a shielded package wherein an electronic component is mounted on a substrate and sealed with a sealant to form a sealed package and the sealed package is coated by a shield layer,
   the method comprising the steps of:
   mounting a plurality of electronic components on a substrate, and charging a sealant onto the substrate and curing the sealant to seal the electronic components;
   cutting the sealant between the plurality of electronic components to form a groove, and separating the electronic components on the substrate into individual packages by the groove;
   applying the conductive coating material of claim 4 onto the substrate where the separated packages is formed by way of spraying;
   heating the substrate coated with the conductive coating material to cure the conductive coating material and therefore form a shielding layer; and
   cutting the substrate where the shielding layer is formed along the groove to obtain individual shielded packages.

* * * * *